(12) United States Patent
Brearley et al.

(10) Patent No.: US 11,592,476 B2
(45) Date of Patent: Feb. 28, 2023

(54) IMPEDANCE TUNERS WITH LINEAR ACTUATORS

(71) Applicant: Maury Microwave, Inc., Ontario, CA (US)

(72) Inventors: David Brearley, Hacienda Heights, CA (US); Gary R. Simpson, Fontana, CA (US)

(73) Assignee: Maury Microwave, Inc., Ontario, CA (US)

( * ) Notice: Subject to any disclaimer, the term of this patent is extended or adjusted under 35 U.S.C. 154(b) by 273 days.

(21) Appl. No.: 17/024,532

(22) Filed: Sep. 17, 2020

(65) Prior Publication Data

US 2022/0082614 A1    Mar. 17, 2022

(51) Int. Cl.
*G01R 31/28* (2006.01)
*G01D 5/14* (2006.01)
*H01P 1/00* (2006.01)
*H01P 3/02* (2006.01)

(52) U.S. Cl.
CPC ........... *G01R 31/2887* (2013.01); *G01D 5/14* (2013.01); *H01P 1/00* (2013.01); *H01P 3/02* (2013.01)

(58) Field of Classification Search
CPC .. G01R 31/2887; G01R 31/2822; G01D 5/14; H01P 1/00; H01P 3/02; H01P 5/04; H03J 1/08
USPC ........................ 324/750.23, 750.16, 537, 500
See application file for complete search history.

(56) References Cited

U.S. PATENT DOCUMENTS

| | | | | |
|---|---|---|---|---|
| 4,626,775 A | * | 12/1986 | Cho | G01R 1/07342 324/750.19 |
| 8,188,816 B1 | * | 5/2012 | Tsironis | H01P 5/04 333/263 |
| 10,079,135 B1 | | 9/2018 | Ripley | |
| 10,258,377 B1 | * | 4/2019 | Lavi | A61B 34/10 |
| 10,637,122 B1 | | 4/2020 | Tsironis | |
| 10,686,239 B1 | | 6/2020 | Tsironis | |
| 10,700,402 B1 | | 6/2020 | Tsironis | |
| 10,983,605 B2 | * | 4/2021 | Fonken | G01S 5/16 |
| 11,137,439 B1 | * | 10/2021 | Tsironis | G01R 35/005 |
| 2003/0169127 A1 | | 9/2003 | Kim et al. | |
| 2007/0052505 A1 | * | 3/2007 | Simpson | H01P 1/15 333/263 |
| 2011/0001579 A1 | | 1/2011 | Boffa et al. | |

(Continued)

FOREIGN PATENT DOCUMENTS

EP    3149800    5/2017
GB    699379    11/1953

OTHER PUBLICATIONS

International Searching Authority, The International Search Report and The Written Opinion of the International Searching Authority, PCT/US2021/050015, dated Jan. 20, 2022.

*Primary Examiner* — Giovanni Astacio-Oquendo
(74) *Attorney, Agent, or Firm* — Larry K. Roberts

(57) ABSTRACT

The accuracy of an impedance tuner may be improved and the size may be reduced by using linear actuators instead of rotary motors. The linear actuator may be integrated with position sensors to allow very small size, and implemented with a servo system for best accuracy and speed. Spring loaded arms holding the mismatch probes allow the tuner to operate in any orientation to further fit into small spaces. The small size reduces losses by allowing direct connection to wafer probes for on-wafer measurement systems.

34 Claims, 17 Drawing Sheets

(56) References Cited

U.S. PATENT DOCUMENTS

2013/0162537 A1* 6/2013 Sato ................. G06F 3/0346
                                                   345/158
2014/0191820 A1   7/2014 Curutchet

* cited by examiner

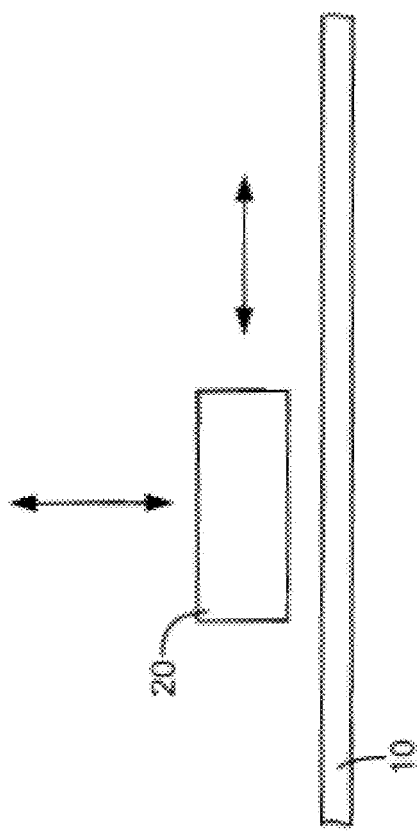
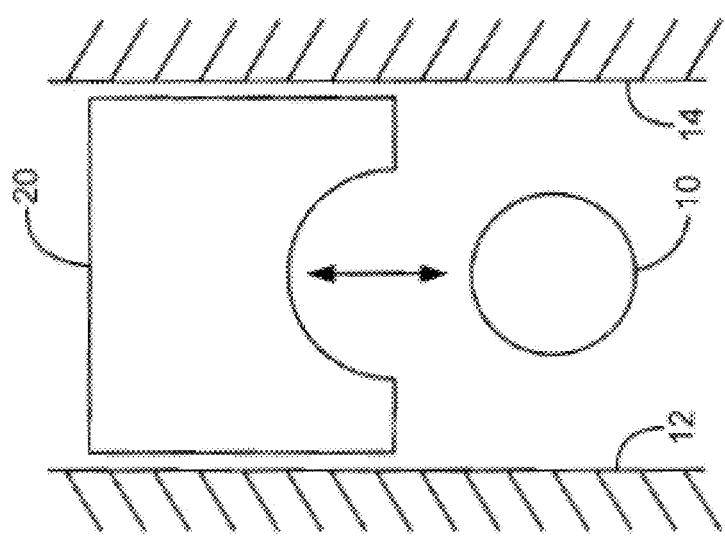

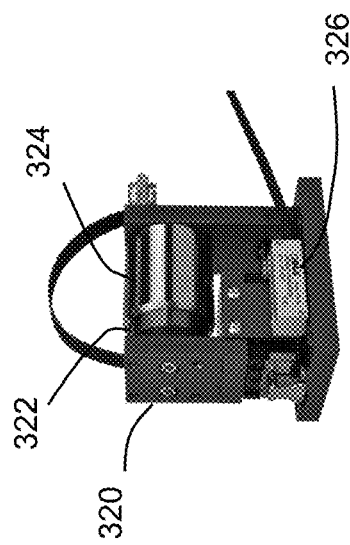
FIG. 8D
FIG. 8E
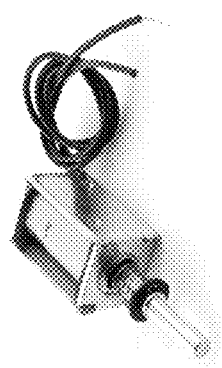
FIG. 8A
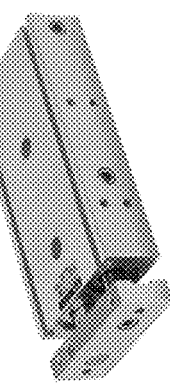
FIG. 8B
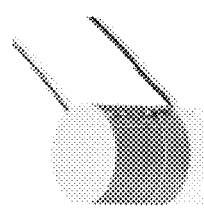
FIG. 8C

IMPEDANCE TUNERS WITH LINEAR ACTUATORS

BACKGROUND

Mechanical Impedance tuners are widely used in characterization of RF devices. The most common type of impedance tuner is the slab line tuner, which typically includes a 50 Ohm TEM slab line, with a movable mismatch probe. FIGS. 1A and 1B illustrate such a tuner in simplified form, with a center conductor 10 supported between opposed conductive ground planes 12, 14 which form the slab line. A mismatch probe 20 is supported for movement along the center conductor (horizontal, or parallel to the signal flow), and also in a direction traverse to the center conductor (vertical, or perpendicular to the signal flow). If the mismatch probe is moved out of the electro-magnetic fields of the slab line, it has almost no effect, allowing the slab line to look like a good 50 Ohm line. However, if the mismatch probe is moved close to the center conductor, the electro-magnetic fields are affected, causing a mismatch. The magnitude of the mismatch is controlled primarily by adjusting the distance of the mismatch probe from the center conductor. The phase of the mismatch is controlled primarily by moving the mismatch probe in a direction parallel to the center conductor. Parallel to the center conductor is also the direction of signal flow in the tuner.

A similar effect can also be done in other transmission line environments, such as waveguide. A slide-screw tuner is a more general term for a mechanical impedance tuner using any type of transmission media. Like the special case of the slab line tuner, a slide screw tuner typically has a carriage with one or more mismatch probes mounted on it. Moving mismatch probes into or away from the electro-magnetic fields varies the magnitude of the mismatch, and moving the carriage varies the phase of the mismatch. FIG. 2 shows an isometric view of a slab line tuner with a movable carriage 514 holding a mismatch probe 512.

In this document, transmission media is something through which an RF signal can travel in a guided manner. Examples of transmission media are slab lines, coaxial lines, microstrip lines, and various types of waveguide.

Tuners are used in a radio frequency (RF) measurement system to measure the response of a device under test (DUT) to changes in impedance. The tuners may control the impedances seen at each port of the DUT at the fundamental frequency of operation (F1), and sometimes other frequencies (F2, F3 . . . ) at the same time. Most commonly, the other frequencies (F2, F3 . . . ) are the harmonics of F1.

FIG. 3 is a block diagram of an RF measurement system which is a basic load pull system. This system measures the RF performance of a DUT. The system includes two impedance tuners to control the source impedance and load impedance seen by the DUT. Such an RF measurement system includes RF test equipment (the RF Source and Power Meter in this case). If the system is automated, there is also a System Controller which controls the tuners and RF test equipment, and collects and records measured data.

Slide-screw tuners may have more than one carriage. Multiple carriages allow independent impedance tuning of multiple frequencies simultaneously.

For the remainder of this document, the word "tuner" is defined as a slide-screw tuner, capable of tuning magnitude and phase of a reflection coefficient at a known reference plane. The tuning is done by moving a mismatch probe on a carriage perpendicular to the direction of signal flow, to primarily tune the reflection magnitude, and by moving the carriage (parallel to the direction of signal flow) to primarily tune the reflection phase. The ZO position of a tuner is a position designated to be used when no tuning is desired. With a slide-screw tuner, this is typically a position with all mismatch probes retracted, away from the electro-magnetic fields of the tuner. It may also be the initialization position. The ZO position is typically a position where the tuner is nominally matched to the ZO of the measurement system. In a coaxial environment, the ZO of the measurement system is commonly 50 Ohms.

For the remainder of this document, the phrase "mismatch probe" will be used to mean a mismatch probe that is part of a tuner.

For the remainder of this document, the word "carriage" will be used to mean a carriage that is part of a tuner, and which carries one or more mismatch probes.

In the prior art, stepper motors have been used to automate various types of slide-screw tuners. Stepper motors provide rotary motion and are designed to move in discrete steps, triggered by one pulse per step. The discrete step size is known, controlled by magnets built into the motor, so the stepper motors are typically used in open loop mode. A controller is normally used to control when and how many pulses are sent to the motor. If a motor needs to move to a specific location, the controller will calculate the number of steps required, and send that number of pulses.

It is desirable for a tuner to move as quickly as possible. With a stepper motor, the speed is controlled by the pulse rate, so a fast pulse rate means fast rotation of the motor. But moving stepper motors at high speeds can cause undesirable vibration. Also, stepper motor torque reduces as the speed increases, so the speed must be limited to have sufficient torque to make a move successfully.

One limitation of the open loop mode is that if friction causes a motor to stall and stop before completing a move, the tuner will be at the wrong position and the controller will not know it. So, in a few cases, position encoders have been added to a tuner to read back the position. In this case, the stepper motors operated in open loop mode, but when the move was complete, the position could be verified.

One limitation of using tuners for impedance control is that losses reduce the matching range, as illustrated in FIG. 4C. The edge of the reflection coefficient chart 35 represents total reflection, or $|\Gamma_{in}|=1$. The dashed line 36 represents the available matching range of the tuner 30 by itself, as shown in FIG. 4A. This means that the tuner can tune to any impedance within that circle. The solid line 37 represents the available matching range after a lossy device 31, such as a cable, is added in front of the tuner 30 as shown in FIG. 4B. This shows that losses in front of the tuner reduce the matching range. Therefore, it is generally desirable to position the tuner as close to the DUT as practical, to avoid adding extra loss of connecting cables.

An important and widely used measurement environment is an RF on-wafer measurement system. A wafer is a flat substrate generally used to fabricate semiconductor and other devices. A wafer typically contains many devices spread across the surface of the wafer, and a device on a wafer is called an on-wafer device. This type of system allows measurement of an on-wafer DUT before dicing or mounting the DUT in a package. In this document, the phrase "on-wafer measurement system" means an RF measurement system where the DUT is an on-wafer device and connections to the DUT are done using wafer probes. The phrase "wafer probe" means a device that connects to an on-wafer DUT or other on-wafer device. A wafer probe will typically have fingers on one side to connect to the DUT, and a connector on the other side to connect to the measurement system. The connector to the measurement system is typically a coaxial connector or waveguide flange.

One limitation of on-wafer measurements is that a microscope is needed to see the DUT and fingers of the wafer probe, in order to make the connection of the wafer probe to the DUT. The microscope can limit how close the tuner can be mounted to the DUT, therefore requiring an extra length of transmission line to make the connection. In FIG. 5, wafer probes 45, 46 are connected to a DUT on the wafer 40, but the large tuners 30, 32 cannot connect directly to the wafer probes 45, 46 because the microscope 41 is in the way. So, the cables 31, 33 must be inserted to make the connections from the tuners to the wafer probes. This adds loss and therefore reduces the available matching range of the tuner. In this document, a large tuner means a tuner that is too large to connect directly to wafer probes without interfering with the microscope. For a tuner to be connected directly to a wafer probe means that a) the tuner connector is connected directly to the connector of the wafer probe with no cables or other extensions needed to make the connection, and b) the tuner connector is a normal connector mounted close to the body of the tuner without any length extension beyond the normal length necessary for ordinary connections.

For on-wafer mounting of tuners, it is desirable to minimize the size of the tuner. One limitation to minimizing the size is the stepper motors. Even small stepper motors are larger than the mismatch probes used in high frequency tuners, so the carriages with the stepper motors and mismatch probes must often be larger than desirable, which then makes the tuners larger. For this document, a high frequency tuner is one where the minimum carriage length (in the direction of signal flow) is limited by the size of the motors. This is typically tuners with frequency ranges covering up to 26.5 GHz or higher.

Embodiments of this invention improve on or eliminate many of the limitations described above.

BRIEF DESCRIPTION OF THE DRAWINGS

Features and advantages of the disclosure will readily be appreciated by persons skilled in the art from the following detailed description when read in conjunction with the drawings wherein:

FIG. 1A is a diagrammatic end view of an impedance tuner slab line and mismatch probe arrangement. FIG. 1B is a diagrammatic view illustrating movement of the mismatch probe in the vertical (transverse to the center conductor and signal flow) and horizontal (parallel to the center conductor and signal flow).

FIGS. 8A-8E show examples of several types of linear actuators. FIG. 8A shows a solenoid actuator. FIG. 8B shows a pneumatic actuator. FIG. 8C shows a piezo-electric actuator. FIG. 8D shows a voice coil actuator. FIG. 8E shows a linear motor actuator.

DETAILED DESCRIPTION

Figure 2:
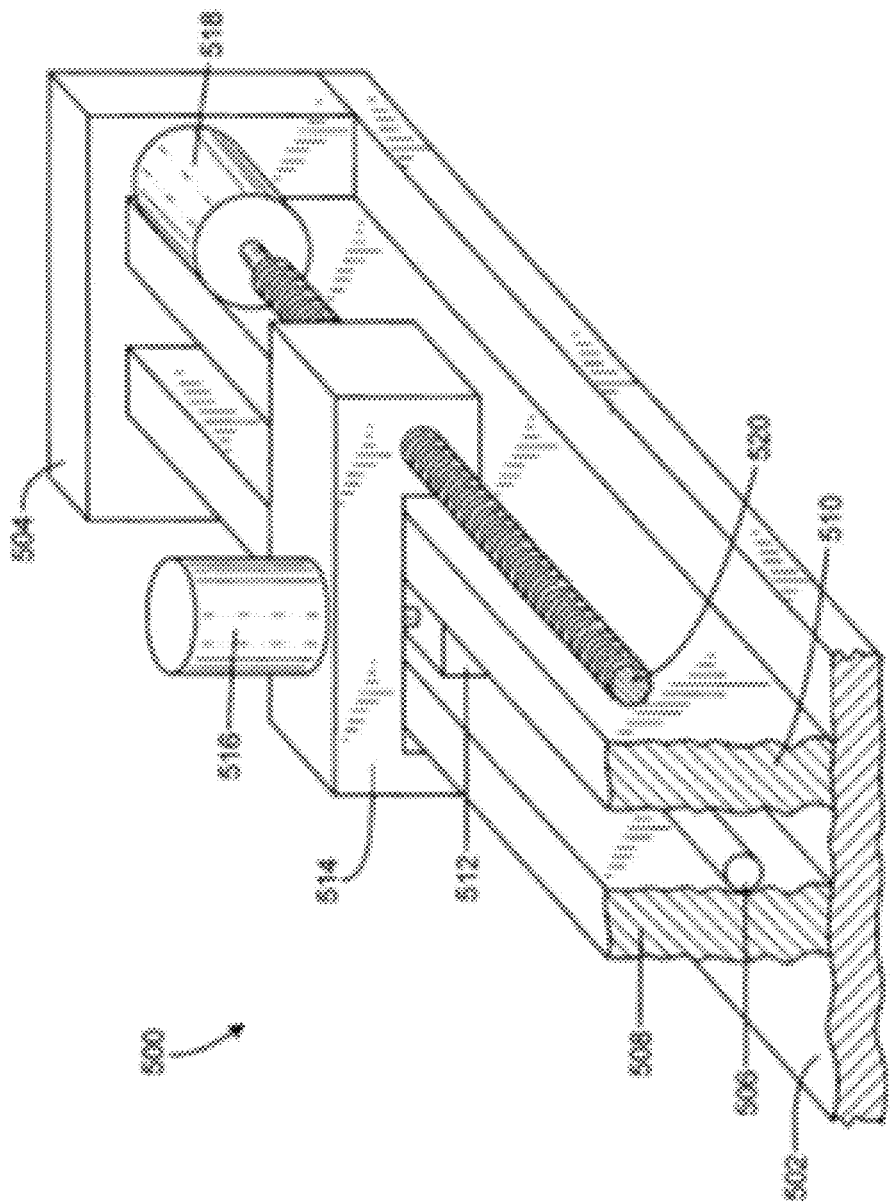
FIG. 2 is an isometric view of a slab line tuner with a moving carriage 514 which carries a mismatch probe 512.
Figure 3:
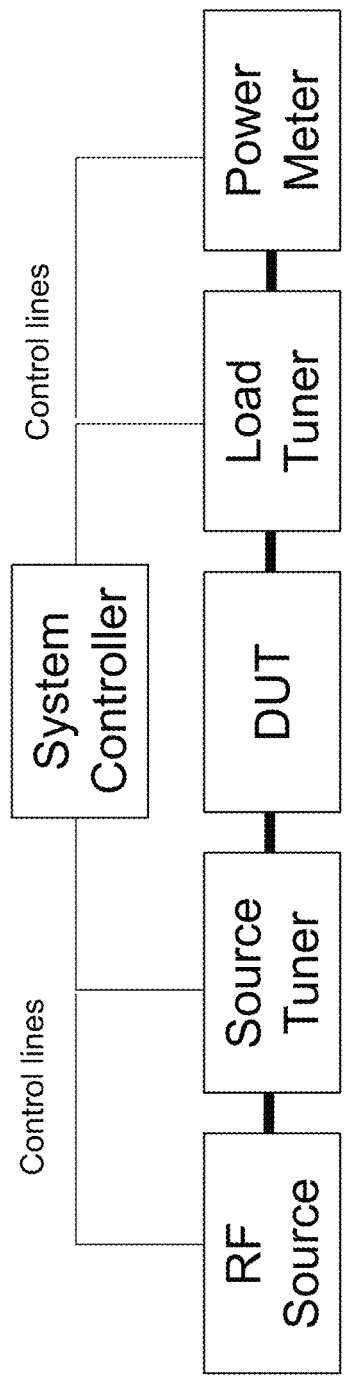
FIG. 3 is a block diagram of a typical RF measurement system, wherein a source tuner controls the source impedance seen by the DUT, and a load tuner controls the load impedance seen by the DUT.
Figure 4C:
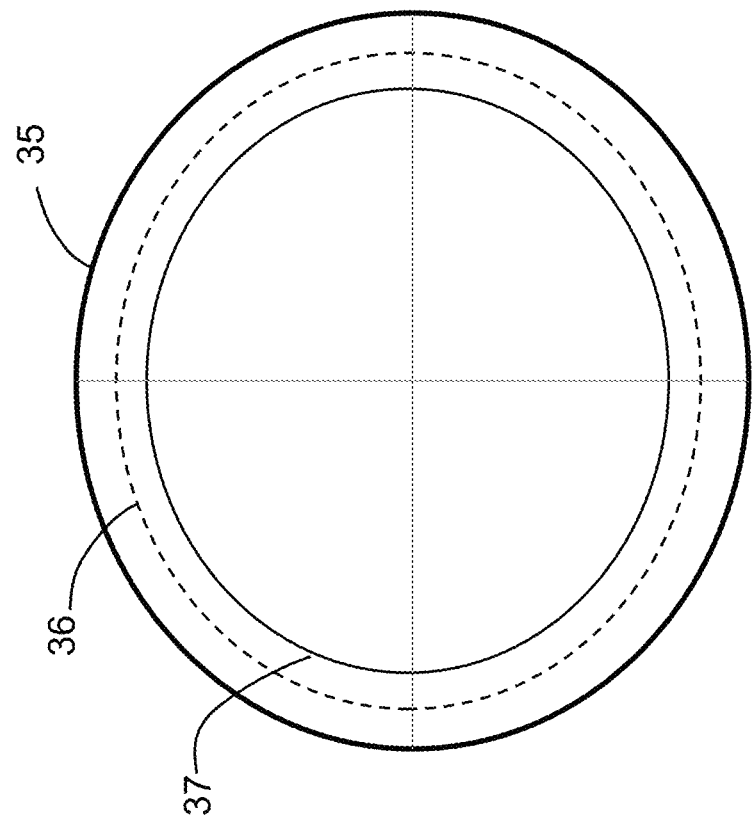
FIGS. 4A, 4B and 4C shows the effect of losses placed in front of a tuner. The matching range 36 of a tuner 30 can get close but never reach the perfect reflection at the edge of the reflection coefficient chart 35. If a lossy device 31 (such as a cable) is placed in front of the tuner 30, the resulting matching range 37 shrinks.
Figure 4A:
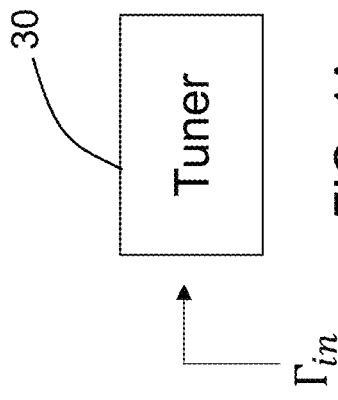
Figure 4B:
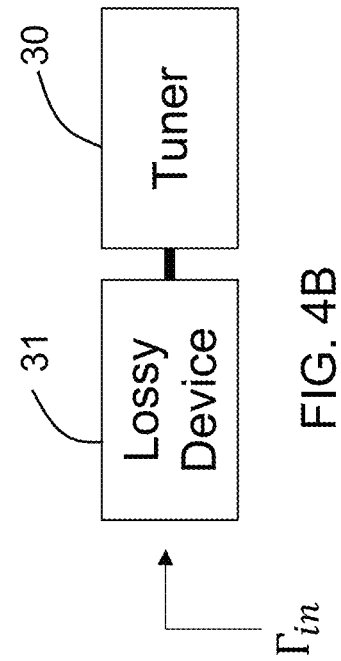

In the following detailed description and in the several figures of the drawing, like elements are identified with like reference numerals. The figures are not to scale, and relative feature sizes may be exaggerated for illustrative purposes.

Figure 5:
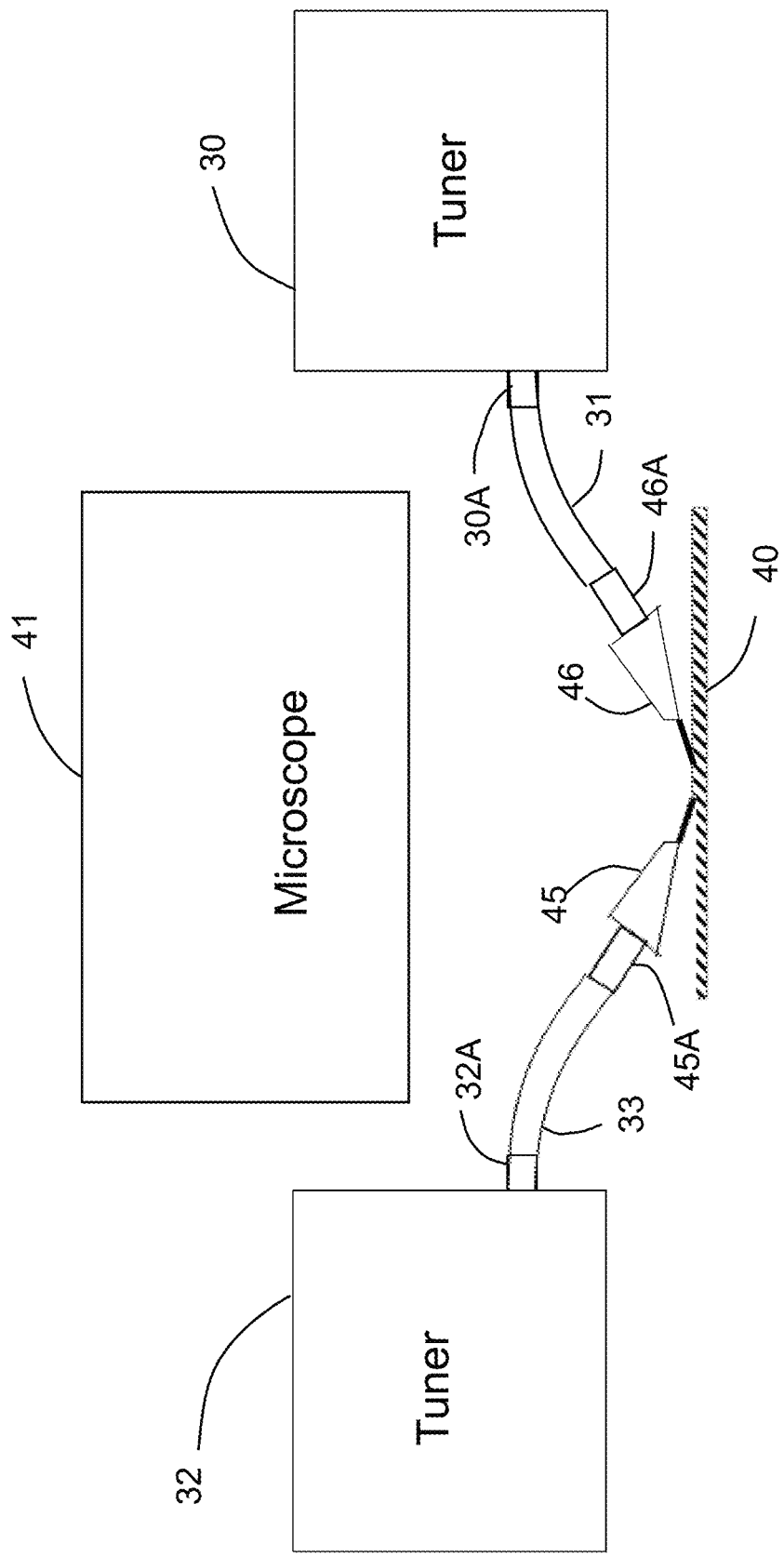
FIG. 5 shows how large tuners 30, 32 cannot connect directly to wafer probes 45, 46 when the wafer probes are connected to a DUT on the wafer 40, because the microscope 41 is in the way.
Figure 6:
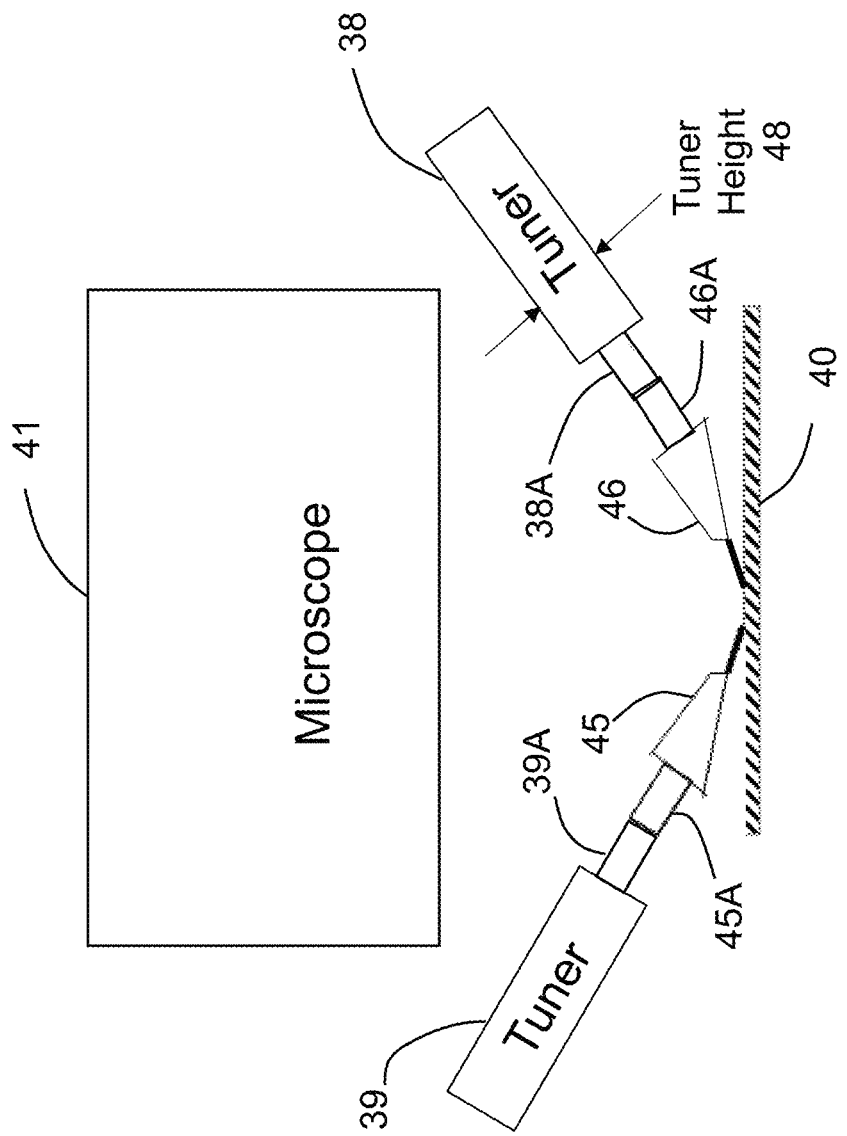
FIG. 6 shows how small tuners 38, 39 can connect directly to the wafer probes 45, 46 when the wafer probes are connected to a DUT on the wafer 40, because the tuners are small enough to fit without interference from the microscope 41.

Exemplary embodiments of this invention include small tuners which can be oriented at any angle to fit available spaces. Orientation in this document can mean vertical, sideways, upside down, or any angle in between. Orientation means the direction of motion of a mismatch probe which is transverse to the direction of signal flow. Therefore, vertical orientation means that the motion of the mismatch probe is vertical. In this document, a small tuner means one that can connect directly to the wafer probes when the wafer probes are connected to a DUT on the wafer, without interference with the microscope. This is shown in FIG. 6, where the wafer probes 45, 46 are connected to a DUT on a wafer 40, and the small tuners 38, 39 are able to connect directly to the wafer probes without any extension cable. The direct connection comprises connecting the connector 39A of the tuner 39 directly to the connector 45A of the wafer probe 45, and connecting the tuner connector 38A of the tuner 38 directly to the connector 46A of the wafer probe 46. This is in contrast to the large tuners 30, 32 in FIG. 5 where extension cables 31, 33 are needed to connect the tuners 30, 32 to the wafer probes 45, 46. The cable 31 goes from the tuner connector 30A to the wafer probe connector 46A. The cable 33 goes from the tuner connector 32A to the wafer probe connector 45A. In FIG. 6, the tuner height 48 of a small tuner may also be less than three inches. Other embodiments include conventionally sized impedance tuners employing linear actuators instead of stepper motors or other sources of rotary motion.

A motor used in the prior art provides rotary motion, and a gear mechanism is then required to convert the rotary motion to linear motion. So, the mechanical connection from the motor to the mismatch probe is indirect, adding the possibility of backlash errors. This mechanism also adds to the tuner size and cost. In FIG. 2, for example, the gear mechanism comprises lead screws. Motor 518 turns a lead screw 520 to move the carriage 514 parallel to the center conductor 506. Mounted on the carriage 514 is another motor 516, which drives a lead screw to move the mismatch probe 512 vertically, perpendicular to the center conductor. In high frequency tuners, the carriage must be bigger than required to carry the mismatch probes, because the carriage must also carry the motors. FIG. 2 shows only one carriage and only one motor on that carriage, but many tuners have carriages with two mismatch probes, and therefore two motors mounted on the carriage. Many tuners also have multiple carriages.

Exemplary embodiments of this invention use linear actuators instead of rotary motors to provide linear motion directly. A linear actuator is a mechanism that directly creates force in one linear direction to move a driven component, guided by constraints to keep the motion in a straight line. Conversion from rotary motion to linear motion is not required. By providing direct linear motion, linear actuators eliminate the gear mechanism required to convert rotary motion to linear motion. Thus, linear actuators also eliminate the backlash inherent in converting rotary motion to linear motion. Linear actuators are also typically smaller than the mechanism driven by rotary motors used in the prior art. For the remainder of this document, the word "actuator" will mean a linear actuator. Embodiments with actuators allow the size of the tuner to be reduced as well as improving accuracy by eliminating backlash errors.

Figure 7:
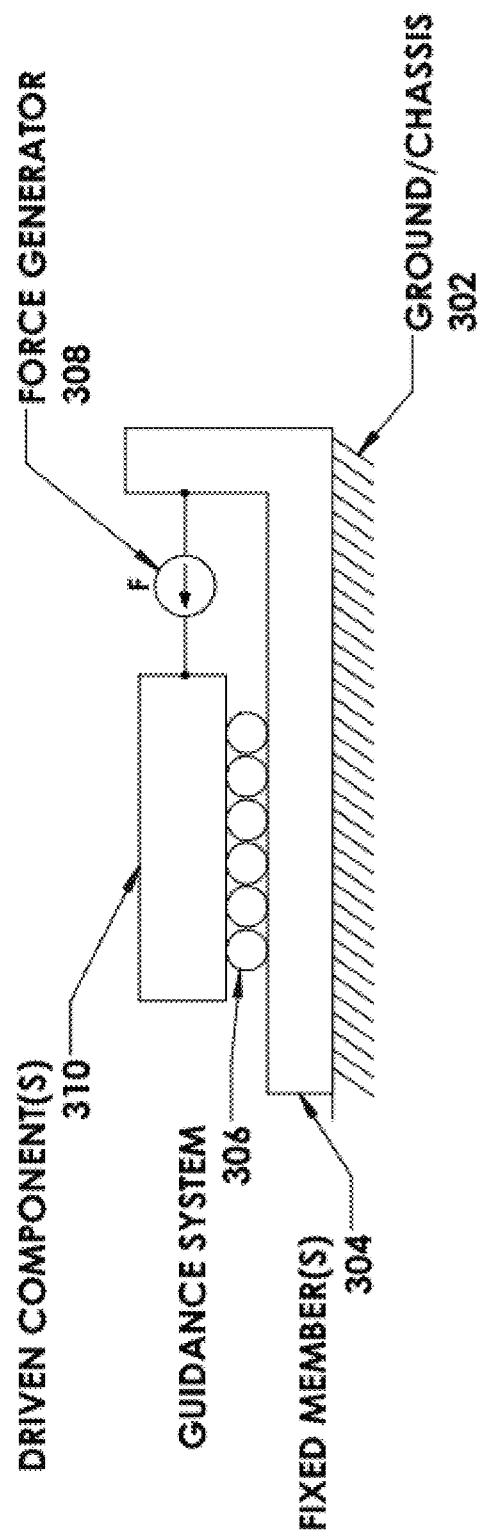
FIG. 7 is a schematic view of a linear actuator. The fixed member 304 is mounted on some type of ground or chassis 302. A force generator 308 provides propulsion to move the driven component 310, where the motion is constrained to a straight line by the guidance system 306.

FIG. 7 shows a schematic of an actuator. The ground/chassis 302 is typically a machine frame or a larger moving component on which the actuator is mounted. The fixed member 304 is the portion of the actuator that remains fixed during motion; it is the frame of the actuator and the means of mounting. The guidance system 306 is shown in this example as a rolling element bearing, although many types of guidance systems may alternatively be employed. The force generator 308 is the propulsion mechanism which is typically a transducer which converts an input (such as electricity) into force and therefore motion. The driven component 310 is the part that moves in the guided direction. In a tuner, the driven component could be a carriage, where the fixed member is mounted on the tuner chassis, i.e. replacing a leadscrew drive or gear drive. In a tuner, the driven component could also be a mismatch probe, where the fixed member is mounted on a carriage.

FIGS. 8A-8E show examples of some different types of linear actuators which may be employed in an impedance tuner application. FIG. 8A shows a solenoid actuator, FIG. 8B shows a pneumatic actuator, FIG. 8C shows a piezoelectric actuator, FIG. 8D shows a voice coil actuator, and FIG. 8E shows a linear motor actuator.

Figure 9A:
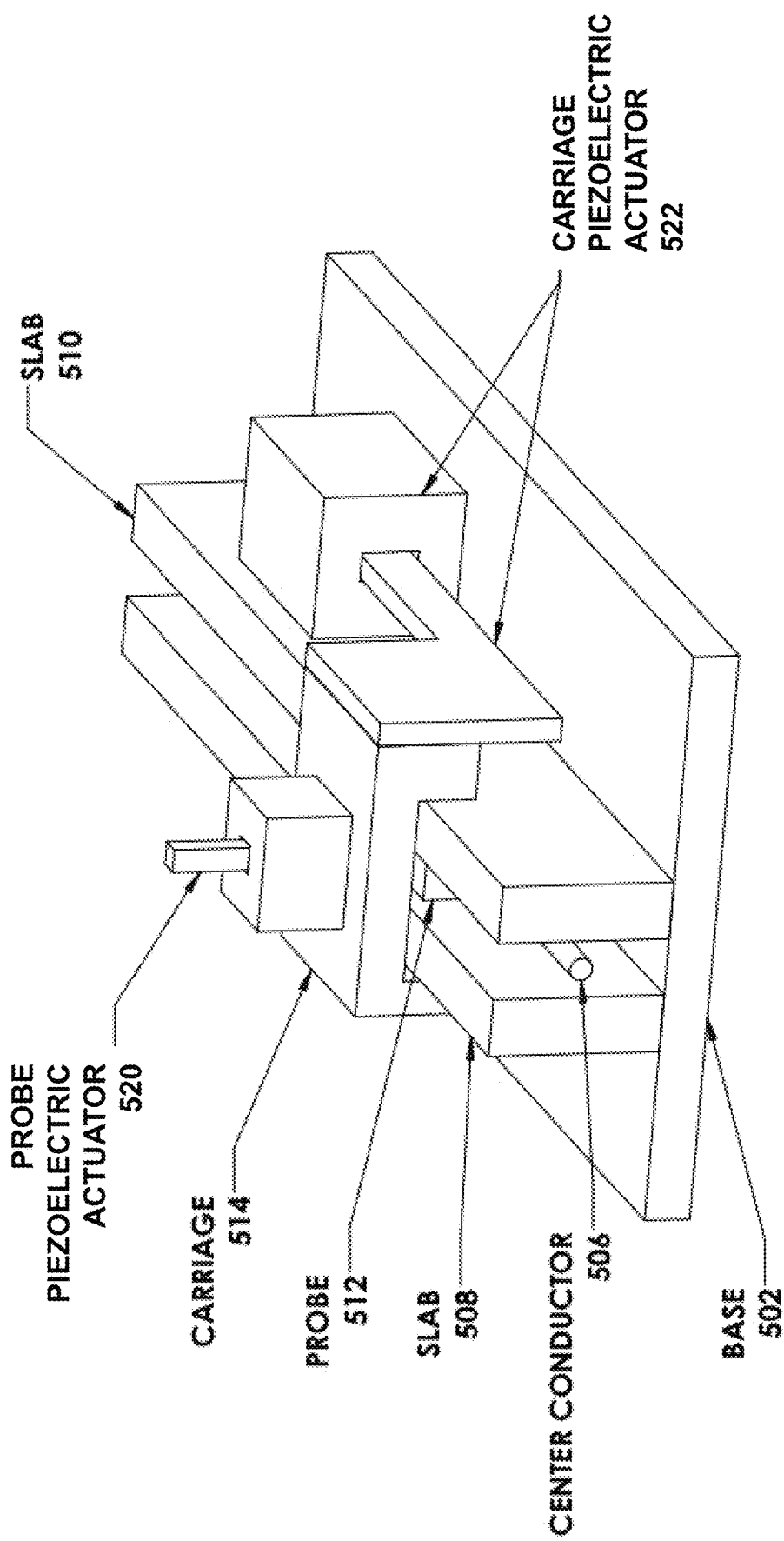
FIG. 9A shows an embodiment of an impedance tuner where a piezo-electric actuator 522 is used to drive motion of the carriage 514, and another piezo-electric actuator 520 is used to drive the motion of the mismatch probe 512.

An exemplary embodiment of an impedance tuner uses a piezo-electric linear actuator. FIG. 9A shows an isometric view of a tuner comprising one piezo-electric actuator 522 to drive the horizontal motion of the carriage 514, parallel to the center conductor 506, and a second piezo-electric actuator 520 to drive the vertical motion of the mismatch probe 512. The vertical motion moves the mismatch probe closer to or farther from the electro-magnetic fields, e.g. closer to or farther away from the tuner center conductor, perpendicular to the signal flow. Piezo-electric actuators convert electrical signals into precisely controlled physical displacements. They produce a high force compared to their volume, and can be quite small. This is particularly suitable at high frequencies where the mismatch probes are small, and the required movement range is small. High frequencies apply to tuners where the length of the drive mechanism for a carriage is longer (in the direction of signal flow) that the total length of mismatch probes on that carriage. This is typically tuners with frequency ranges covering up to 26.5 GHz or higher. Piezo-electric actuators allow the design of small tuners for optimum on-wafer connections.

Another exemplary embodiment uses a voice-coil as a linear actuator. A common example of a voice coil actuator is the actuator used in an audio speaker. FIG. 8D shows another example. The coil 322 which provides the propulsion is attached to the fixed member 320, and slides in the guidance bearing 324. A position sensor 326 is integrated into the assembly. A voice coil produces very fast motion, but the range of motion is limited. This is also suitable for use at high frequencies where the mismatch probes are small and the required movement range is small.

Figure 9B:
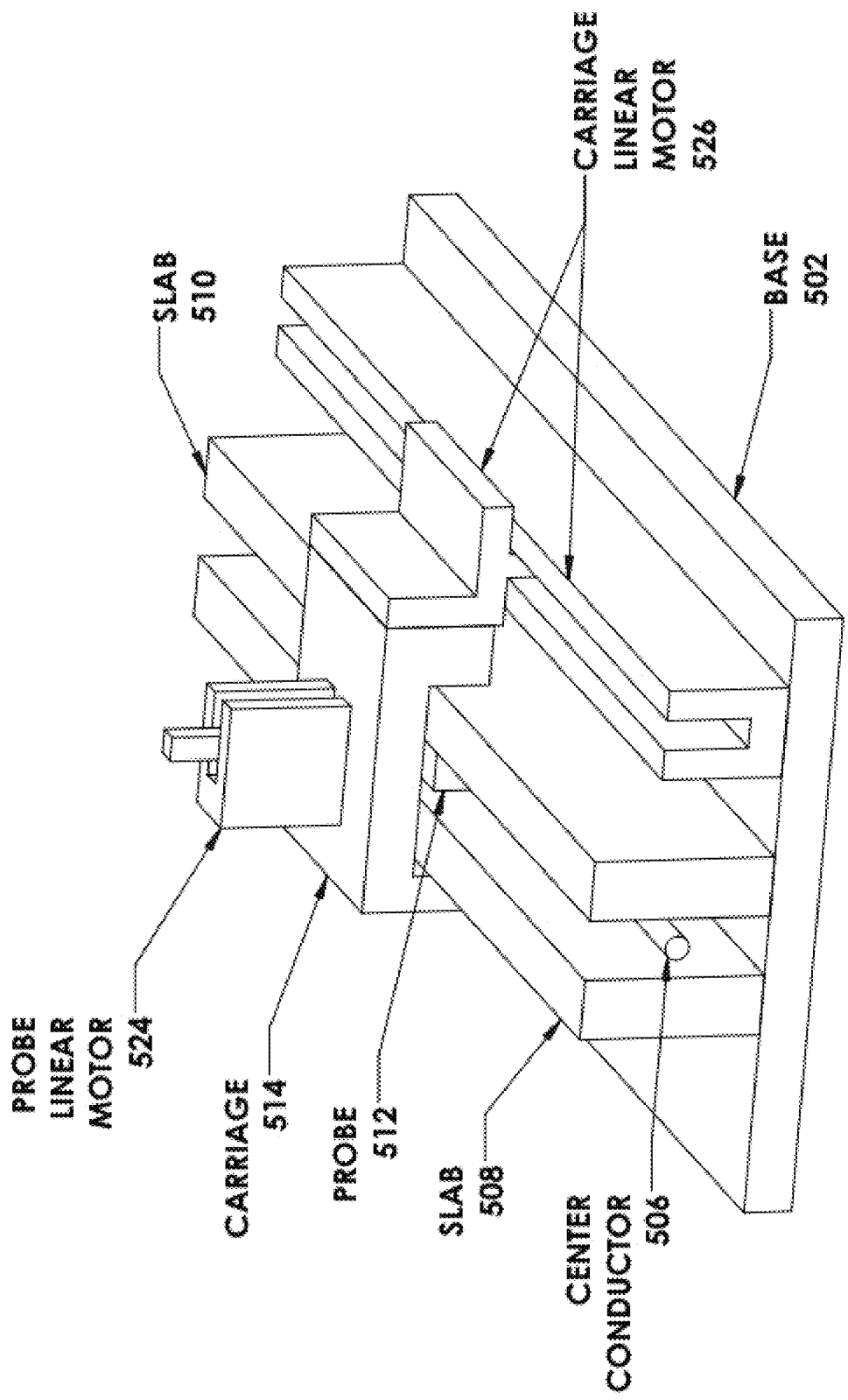
FIG. 9B shows an embodiment of an impedance tuner where a linear motor actuator 526 is used to drive motion of the carriage 514, and another piezo-electric actuator 524 is used to drive the motion of the mismatch probe 512.

Another exemplary embodiment uses a linear motor actuator. A linear motor has magnets and coils that are laid out flat to provide linear motion directly. An example is shown in FIG. 8E. FIG. 9B shows an isometric view of a tuner comprising one linear motor actuator 526 to drive the horizontal motion of the carriage 514, and a second linear motor actuator 524 to drive the vertical motion of the mismatch probe 512.

Figure 10A:
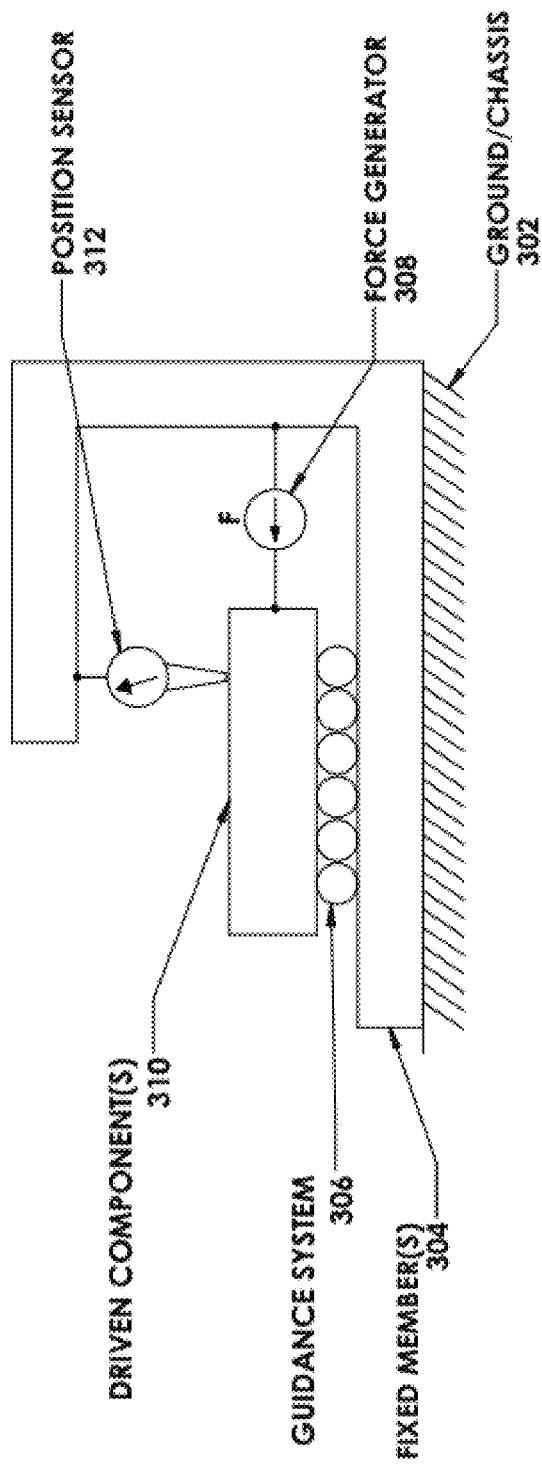
FIG. 10A is a schematic view of a linear actuator with position measurement built in. It is similar to FIG. 7, except that a position sensor 312 is mounted on the fixed member 304 such that the position sensor 312 can read the position of the driven component 310.

A further exemplary embodiment is to build a position sensor into the actuator. FIG. 10A shows a schematic of a linear actuator with a position sensor. As the driven component 310 moves, the position sensor 312 reads the position of the driven component 310. Typically, the position sensor 312 can read the position continuously and provide that position data to a controller in real time while the driven component 310 is moving.

Figure 10B:
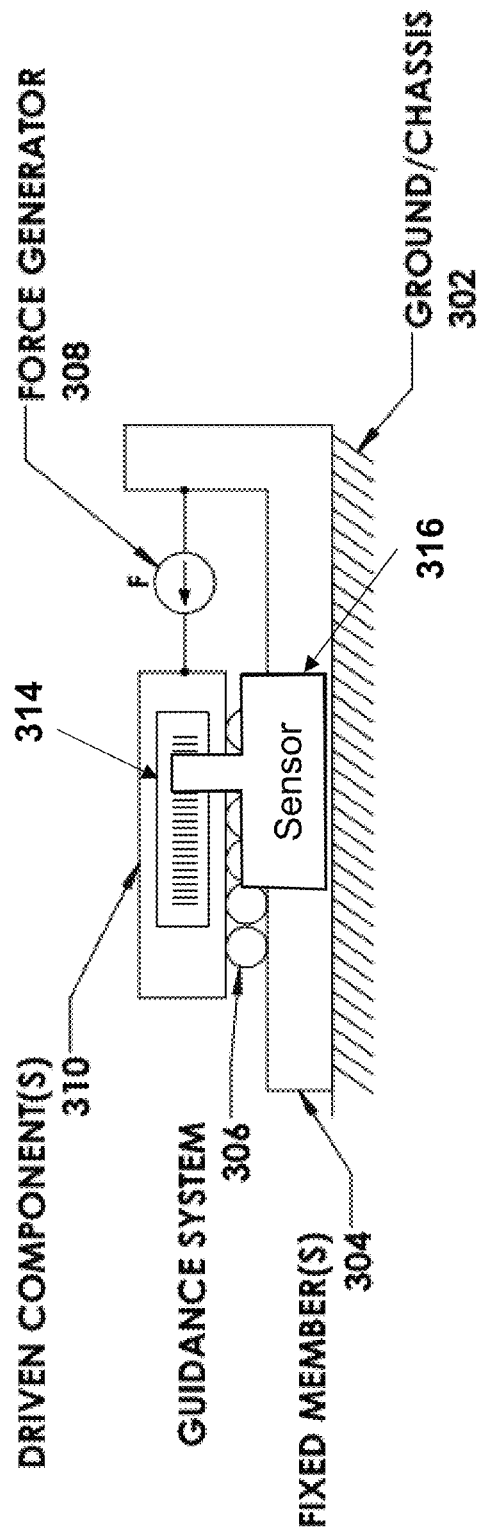
FIG. 10B is a schematic view of a linear actuator with position measurement built in. In this case, the position sensor is a linear encoder.

An exemplary embodiment of a position sensor is a position encoder. Rotary encoders read and feedback position of rotary motion, such as motor position. Linear encoders read and feedback position of linear motion. In this document, the word encoder means either a rotary or linear position encoder, a device configured to read the position of a carriage or mismatch probe, to provide feedback with the position data. FIG. 10B shows a schematic of a linear actuator with a linear encoder. In this embodiment, the encoder comprises two parts, a scale 314 which is attached to the driven component 310, and a sensor 316 which is attached to the fixed member 304. As the driven component 310 moves, the sensor 316 reads the scale 314 to measure the position of the driven component 310. Alternatively, the scale could be attached to the fixed member 304 and the sensor 316 attached to the driven member.

In the prior art, separate encoders were mounted on the tuners for position feedback after a move was complete. Separate encoders add to the size of the tuner. An embodiment of this invention is to integrate the position sensor into an actuator used in the tuner. This has the advantage of reducing size since a separate position sensor is not required. Also, the position sensor is connected more directly to the drive mechanism for better stability and less backlash, and therefore better accuracy.

Figure 11:
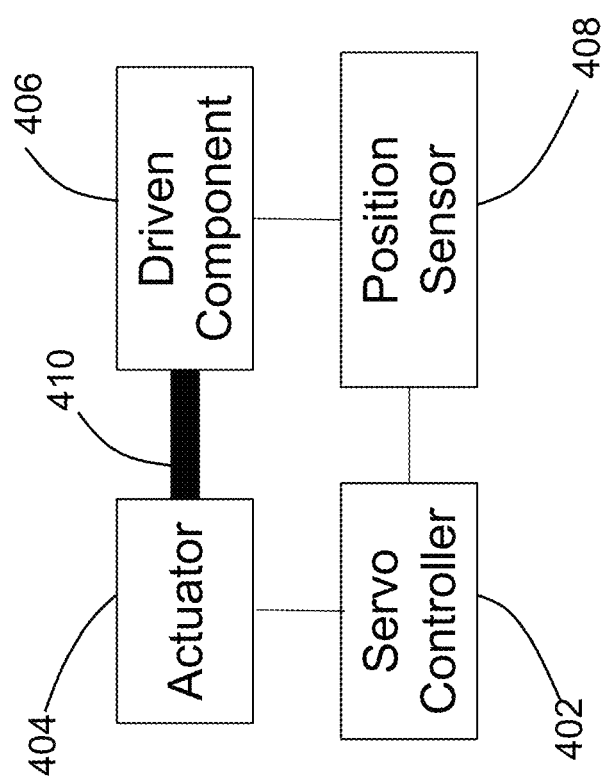
FIG. 11 shows a block diagram of a servo system. The bold connection 410 between the actuator 404 and the driven component 406 represents a mechanical connection.

If the actuator is operated in an open loop arrangement, the position sensor can be used to verify the position after the movement is complete. But a bigger benefit occurs when the actuator is used in a closed loop arrangement, as in a servo system. A "servo system" is a system where closed loop feedback is used to calculate the optimum control signal applied to the actuator vs. time during a move, to create smooth acceleration, highest possible speed, and then smooth deceleration. FIG. 11 shows a block diagram of a servo system. The bold line 410 is the mechanical connection between the force generator of the actuator and the driven component. The thin lines between the other blocks represent the signal connections. The servo controller 402 sends signals to the actuator 404 to start the motion of the driven component 406. The position sensor 408 measures the position of the driven component, and feeds this back to the servo controller. In real time, the servo controller calculates how to continually adjust the signal sent to the actuator. The calculation is done using a "servo equation". During a move, the first derivative of position with respect to time is speed, and the second derivative of position with respect to time is acceleration. The servo equation will use position feedback, and may also speed, and even acceleration to make the moves as smooth, fast, and accurate as possible.

Figure 12:
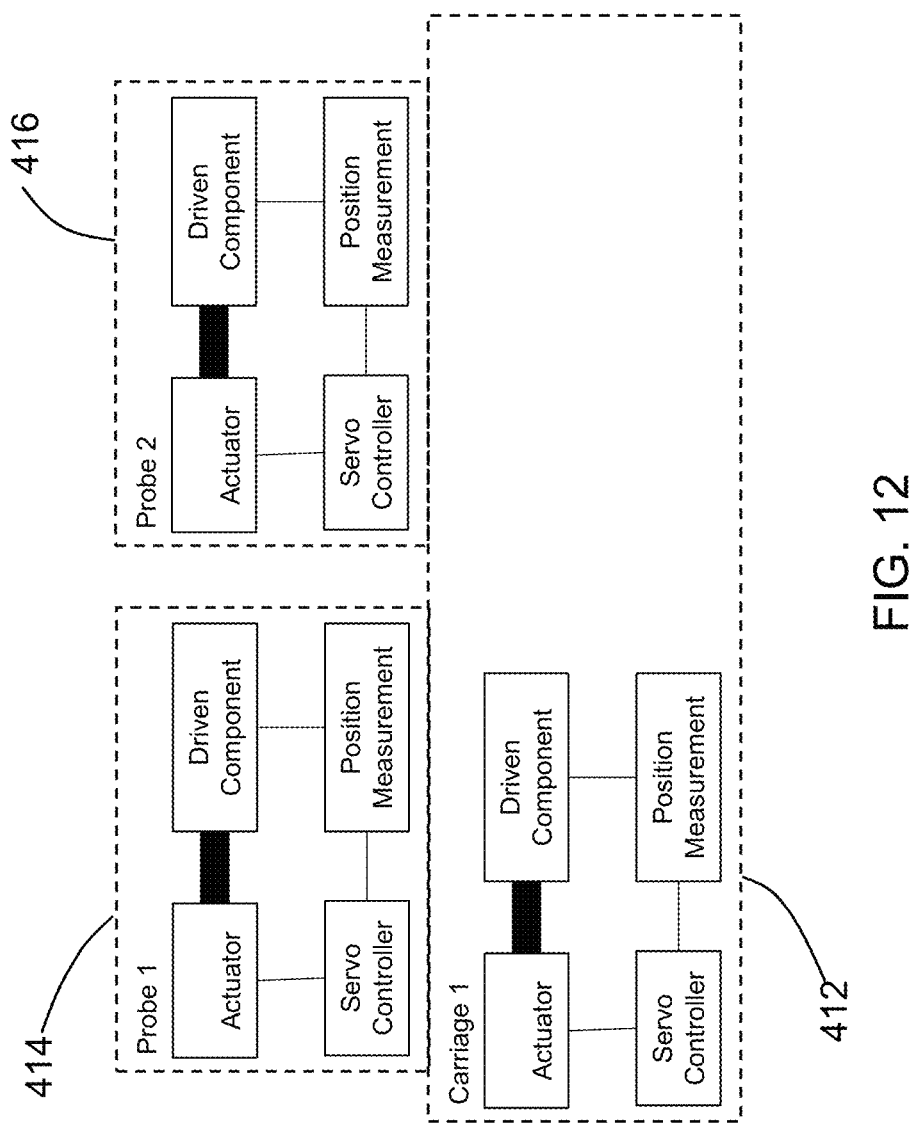
FIG. 12 shows a block diagram of multiple servo systems, where each individual servo system controls one axis of motion in an impedance tuner.

FIG. 12 shows a block diagram of multiple servo systems, where each individual servo system controls one axis of motion in an impedance tuner. In this example, the tuner includes a carriage which mounts two mismatch probes. Servo system 412 controls the movement and positioning of the carriage. Servo systems 414 and 416 control the movement and positioning of the respective probes.

Figure 13:
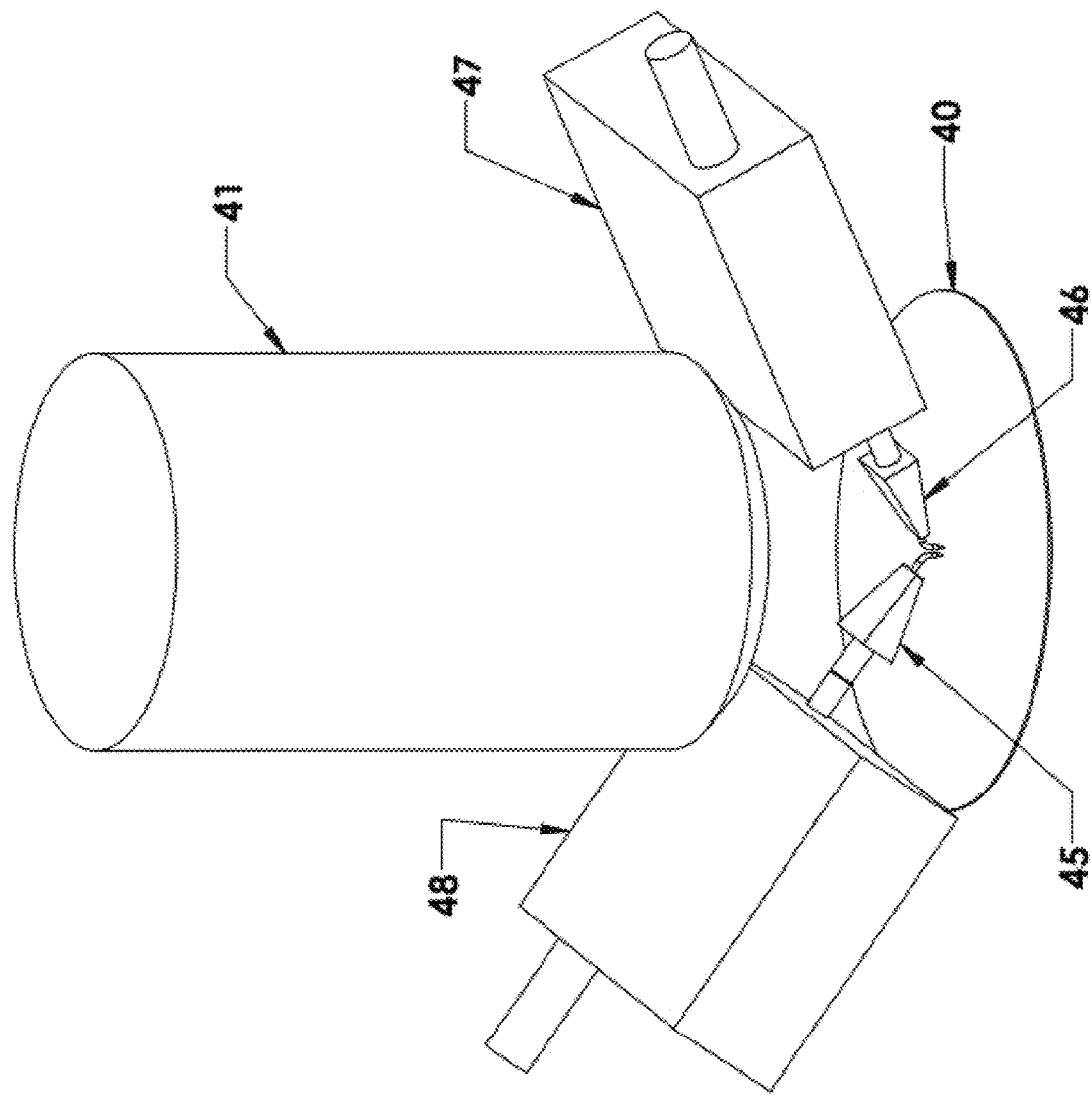
FIG. 13 is an isometric view of small tuners 47, 48 which are oriented sideways to avoid interference with the microscope 41 in order to connect directly to the wafer probes 45, 46 which are connected to a DUT on the wafer 40.

In the prior art, tuners were generally oriented so that the slab lines were vertical, and the mismatch probes entered the slab line from the top. These prior art tuners needed the vertical orientation for best accuracy. But in order to fit the tuner into tight spaces, another embodiment of this invention is a tuner that can be oriented in any direction. For example, if the tuner is mounted sideways, it may be able to better connect directly to the wafer probe and avoid conflict with the microscope in an on-wafer setup. This is illustrated in FIG. 13, where tuners 47, 48 are oriented sideways to connect directly to the wafer probes 45, 46 which are connected to a DUT on the wafer 40, with plenty of clearance from the microscope 41.

Figure 14:
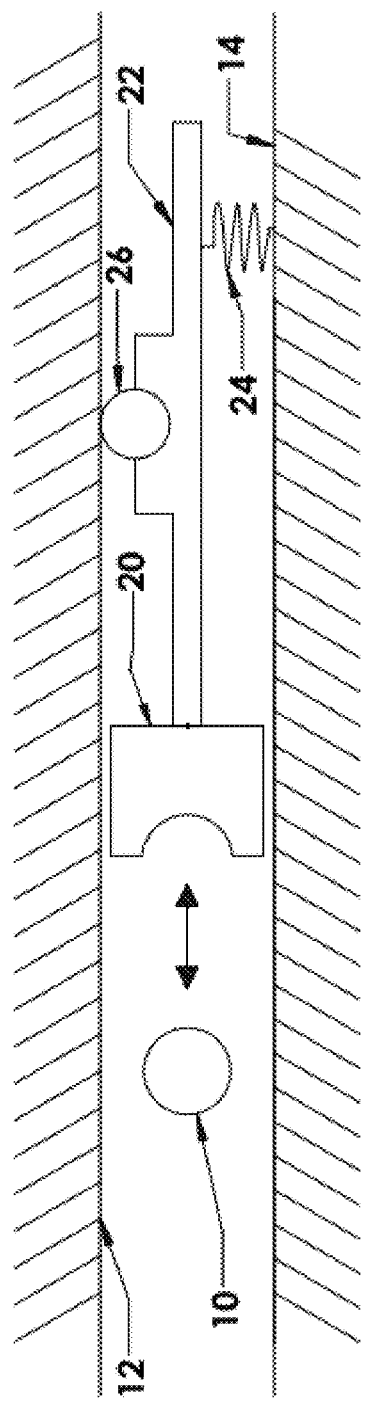
FIG. 14 is a diagrammatic end view of an impedance tuner comprising a slab line with ground planes 12, 14 and a center conductor 10, and including a mismatch probe 20. The mismatch probe motion that is transverse to the center conductor 10 is horizontal motion, where the tuner is oriented sideways, and where the mismatch probe 20 is held with an arm 22 that is spring loaded with a spring 24 pushing against a ball bearing 26.

In order to enable the tuner to mount in any orientation, an embodiment of this invention is to spring load the arm holding the mismatch probe so that the direction of gravity does not affect its positional accuracy. In this document, an arm that is spring loaded is a support arm that holds a mismatch probe, and that arm is spring loaded sideways against the side of the transmission media. Sideways against the side of the transmission media means perpendicular to the signal flow and perpendicular to the direction of the mismatch probe motion. This concept is illustrated in FIG. 14, whereby the two slabs 12, 14 are oriented sideways, the mismatch probe 20 moves horizontally perpendicular to the center conductor 10. A support arm 22 holding the mismatch probe is spring loaded with spring 24 against ball bearing 26 to keep the mismatch probe centered. Spring loading is not limited to the simple spring in FIG. 14, which is shown simply to illustrate the concept. The actual spring loading method should be selected to best fit the specific mechanical design of the tuner.

Figure 15:
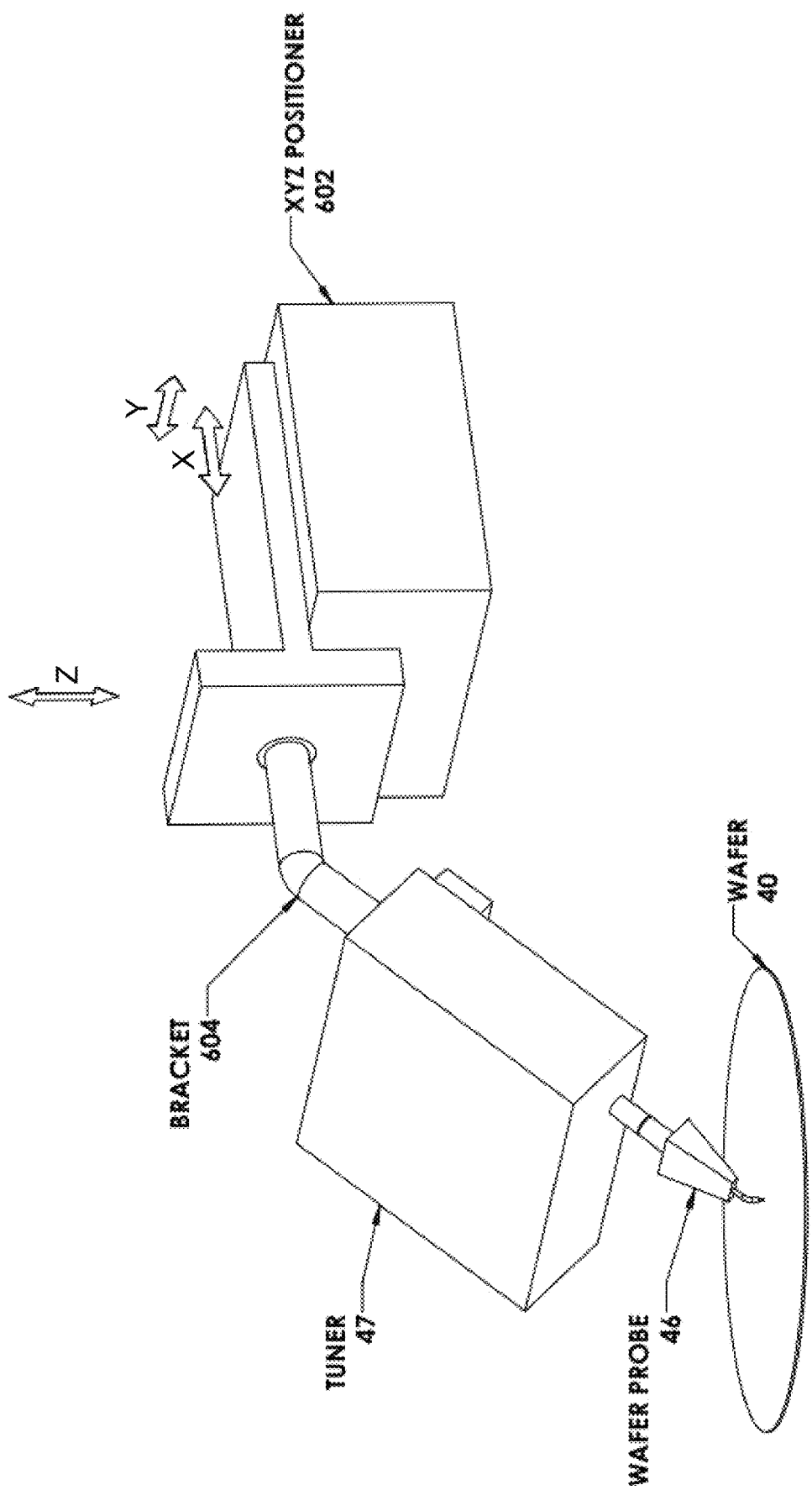
FIG. 15 shows a tuner mounted to an XYZ positioner with a bracket to allow the tuner to connect directly to the wafer probe at the correct angle of the wafer probe.

In an on-wafer measurement system, the wafer-probe positions must be adjustable in 3 dimensions (3D) to connect properly to an on-wafer device. The three dimensions can be labelled x, y, and z, where x and y are horizontal dimensions and z is the vertical dimension. This 3D positioning is typically done by mounting the wafer probe on a 3-axis positioner (called an XYZ positioner). In order to connect tuners directly to the wafer probes to minimize loss, the tuner and probes must move together. In that case therefore, the mismatch probe can be mounted firmly to the tuner, and the tuner can be mounted to the XYZ positioner. The mounting of the tuner to the positioner can be done with an appropriate bracket or support, which will hold the tuner at the correct angle to mate with the wafer probe. FIG. 15 shows an exemplary embodiment of this method of mounting. The wafer probe 46 is rigidly connected to the tuner 47, which in turn is mounted to the XYZ positioner 602 by bracket 604. The XYZ positioner moves the tuner and probe in three axes to precisely position the wafer probe 46 to a device on the wafer 40. Not shown in FIG. 15 is the microscope which is used in a typical application. The type of bracket 604 or support depends on the requirements of a particular application.

Although the foregoing has been a description and illustration of specific embodiments of the subject matter, various modifications and changes thereto can be made by persons skilled in the art without departing from the scope and spirit of the invention.

The invention claimed is:

1. A tuner comprising a mismatch probe and at least one linear actuator, wherein:
the mismatch probe is configured for movement in a first direction of signal flow along a transmission media and a second direction perpendicular to the signal flow, and whereby at least one of said first and second directions of movement is accomplished by the at least one linear actuators;
wherein the transmission media is a slab line or waveguide, and said at least one linear actuator comprises a mechanism configured to create force in one linear direction to move said mismatch probe without conversion from rotary motion to linear motion, and a constraint system to keep motion in a straight line.

2. The tuner of claim 1, wherein a first linear actuator is configured to move a carriage for motion parallel to the signal flow, and a second linear actuator is mounted on the carriage and configured to move the mismatch probe for motion perpendicular to the signal flow.

3. The tuner of claim 1, further comprising at least one position sensor configured to measure the position in at least one direction of motion.

4. The tuner of claim 3, wherein motion in at least one direction of the mismatch probe is controlled with a servo system.

5. The tuner of claim 3, wherein at least one position sensor is an encoder.

6. The tuner of claim 1, wherein at least one linear actuator is integrated with a position sensor.

7. The tuner of claim 1 wherein said at least one linear actuator comprises a piezo-electric actuator.

8. The tuner of claim 1 wherein said at least one linear actuator comprises a voice coil actuator.

9. The tuner of claim 1 wherein said at least one linear actuator comprises a linear motor actuator.

10. The tuner of claim 1, wherein said mismatch probe is mounted to an arm that is spring loaded sideways against a side of the transmission media so that a direction of gravity does not affect positional accuracy of the mismatch probe.

11. The tuner of claim 1, whereby the tuner is a small tuner configured to connect directly to a wafer probe when the wafer probe is connected to a DUT on the wafer, without interference with a microscope viewing the wafer to make the connection to the probe.

12. The tuner of claim 1, wherein the tuner has a height dimension less than three inches.

13. The tuner of claim 1, wherein the tuner is a high frequency tuner with a frequency range covering up to 26.5 GHz or higher.

14. A tuner comprising:
a transmission media, wherein the transmission media is a slab line or waveguide;
a mismatch probe configured for movement in the direction of signal flow along the transmission media and perpendicular to the signal flow; and
wherein the mismatch probe is held by an arm which is spring loaded sideways against a side of the transmission media.

15. The tuner of claim 14, wherein the transmission media is a slab line.

16. The tuner of claim 14, wherein the transmission media is waveguide.

17. The tuner of claim 14 wherein the tuner is mounted with an orientation other than vertical.

18. A measurement system comprising:
an impedance tuner that uses a linear actuator for at least one direction of motion, the impedance tuner comprising a slab line or waveguide transmission media;
wherein said linear actuator comprises a mechanism configured to create force in one linear direction without conversion from rotary motion to linear motion, and a constraint system to keep motion in a straight line.

19. The system of claim 18, whereby the tuner comprises a first linear actuator configured to move a carriage for motion parallel to a signal flow, and a second linear actuator is mounted on the carriage for motion perpendicular to the signal flow.

20. The tuner of claim 18, wherein at least one position sensor is used to measure the position in at least one direction of motion.

21. The tuner of claim 20, wherein at least one position sensor is an encoder.

22. The system of claim 20 whereby at least one direction of motion in the impedance tuner is controlled with a servo system.

23. The system of claim 18 whereby the impedance tuner comprises a linear actuator integrated with a position sensor.

24. The system of claim 18 wherein the linear actuator of the tuner comprises a piezo-electric linear actuator.

25. The system of claim 18 wherein the tuner comprises at least one linear actuator which is a voice coil actuator.

26. The system of claim 18 wherein the tuner comprises at least one linear actuator which is a linear motor actuator.

27. The system of claim 18 wherein the tuner comprises at least one mismatch probe mounted to an arm that is spring loaded sideways against a side of the transmission media so that a direction of gravity does not affect positional accuracy of the mismatch probe.

28. The system of claim 18 wherein the tuner is mounted with an orientation other than vertical.

29. The system of claim 18 whereby the system is an on-wafer measurement system, and wherein at least one tuner is connected directly to a wafer probe, whereby the tuner is a small tuner configured to connect directly to the wafer probe when the wafer probe is connected to a Device Under Test (DUT) on a wafer, without interference with a microscope viewing the wafer to make the connection to the probe.

30. The system of claim 29, further comprising:
an XYZ positioner; and
wherein the impedance tuner and the wafer probe are mounted to the XYZ positioner to position the wafer probe relative to the wafer.

31. A measurement system comprising a tuner comprising:
a slab line or waveguide transmission media;
a mismatch probe configured for movement in the direction of signal flow along the transmission media and perpendicular to the signal flow; and
wherein the mismatch probe is held by an arm which is spring loaded sideways against a side of the transmission media.

32. The system of claim 31, wherein the transmission media is a slab line.

33. The system of claim 31, wherein the transmission media is waveguide.

34. The system of claim 31 wherein the tuner is mounted with an orientation other than vertical.

* * * * *